(12) United States Patent
Hosaka

(10) Patent No.: US 11,887,947 B2
(45) Date of Patent: Jan. 30, 2024

(54) ELECTRONIC DEVICE INCLUDING CONDUCTIVE ELEMENT ON SIDE SURFACE OF SUBSTRATE

(71) Applicant: Innolux Corporation, Miao-Li County (TW)

(72) Inventor: Shuhei Hosaka, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/974,553

(22) Filed: Oct. 27, 2022

(65) Prior Publication Data

US 2023/0046861 A1 Feb. 16, 2023

Related U.S. Application Data

(63) Continuation of application No. 17/159,151, filed on Jan. 27, 2021, now Pat. No. 11,515,271.

(51) Int. Cl.
*H01L 23/00* (2006.01)
*H01L 25/065* (2023.01)

(52) U.S. Cl.
CPC .............. *H01L 24/03* (2013.01); *H01L 24/05* (2013.01); *H01L 24/43* (2013.01); *H01L 24/45* (2013.01); *H01L 25/0657* (2013.01); *H01L 2224/04042* (2013.01)

(58) Field of Classification Search
CPC ......... H01L 24/03; H01L 24/05; H01L 24/43; H01L 24/45; H01L 25/0657; H01L 2224/04042
See application file for complete search history.

(56) References Cited

U.S. PATENT DOCUMENTS

| 6,060,113 | A | * | 5/2000 | Banno | H01J 1/316 427/78 |
| 2005/0062166 | A1 | * | 3/2005 | Kang | H01L 29/0657 257/E29.022 |
| 2009/0020889 | A1 | * | 1/2009 | Murayama | H01L 24/82 438/109 |
| 2009/0325344 | A1 | * | 12/2009 | Takiar | H01L 24/97 438/109 |

(Continued)

FOREIGN PATENT DOCUMENTS

| EP | 3112931 A1 | * | 1/2017 | ....... G02F 1/133308 |
| GB | 2542503 A | * | 3/2017 | ........... G02F 1/1339 |

*Primary Examiner* — Mamadou L Diallo
(74) *Attorney, Agent, or Firm* — JCIPRNET

(57) ABSTRACT

An electronic device includes a first substrate, a second substrate, a first conductive element, a second conductive element and a third conductive element. The first substrate has a top surface and a first side surface. The second substrate is oppositely disposed on the first substrate and has a second side surface parallel to the first side surface. The first conductive element and the third conductive element are disposed on the top surface of the first substrate. The second conductive element is disposed on the first side surface of the first substrate and the second side surface of the second substrate. The third conductive element contacts the first conductive element to define a first contact area, the third conductive element contacts the second conductive element to define a second contact area, and the first contact area is greater than the second contact area.

11 Claims, 14 Drawing Sheets

(56) References Cited

U.S. PATENT DOCUMENTS

| | | | |
|---|---|---|---|
| 2010/0055605 A1* | 3/2010 | Seo | G03F 7/2018 430/319 |
| 2012/0067940 A1* | 3/2012 | Calpito | H01L 24/13 228/159 |
| 2015/0202656 A1* | 7/2015 | Takahashi | B06B 1/06 310/300 |
| 2018/0307346 A1* | 10/2018 | Lee | G06F 3/0443 |
| 2018/0358385 A1* | 12/2018 | Bae | H01L 23/482 |
| 2020/0227388 A1* | 7/2020 | Waidhas | H01L 25/0657 |
| 2020/0264468 A1* | 8/2020 | Park | G02F 1/13452 |
| 2020/0271979 A1* | 8/2020 | Roh | H01L 23/49838 |
| 2021/0305346 A1* | 9/2021 | Kwak | H01L 24/05 |
| 2021/0366378 A1* | 11/2021 | Zhao | G09F 9/302 |
| 2021/0391302 A1* | 12/2021 | Kao | H01L 24/08 |
| 2022/0005813 A1* | 1/2022 | Kwon | G11C 11/4097 |

* cited by examiner

ELECTRONIC DEVICE INCLUDING CONDUCTIVE ELEMENT ON SIDE SURFACE OF SUBSTRATE

CROSS-REFERENCE TO RELATED APPLICATION

This application is a continuation-in-part application of and claims the priority benefit of U.S. application Ser. No. 17/159,151, filed on Jan. 27, 2021, now allowed. The entirety of the above-mentioned patent application is hereby incorporated by reference herein and made a part of specification.

BACKGROUND

Technical Field

The disclosure relates to an electronic device, and more particularly to an electronic device capable of reducing contact resistance.

Description of Related Art

Electronic products have become indispensable in modern society. With the rapid development of electronic products, certain technologies (such as connection technologies) used in electronic products are constantly improving. How to improve the efficiency of electronic devices has become a continuous improvement project.

SUMMARY

The disclosure is directed to an electronic device, which has the effect of ensuring the electric transmission between surfaces of various dimensions in the electronic device.

According to an embodiment of the disclosure, an electronic device includes a first substrate, a second substrate, a first conductive element, a second conductive element and a third conductive element. The first substrate has a top surface and a first side surface. The second substrate is oppositely disposed on the first substrate and has a second side surface parallel to the first side surface. The first conductive element is disposed on the top surface of the first substrate. The second conductive element is disposed on the first side surface of the first substrate and the second side surface of the second substrate. The third conductive element is disposed on the top surface of the first substrate. The third conductive element contacts the first conductive element to define a first contact area, the third conductive element contacts the second conductive element to define a second contact area, and the first contact area is greater than the second contact area.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
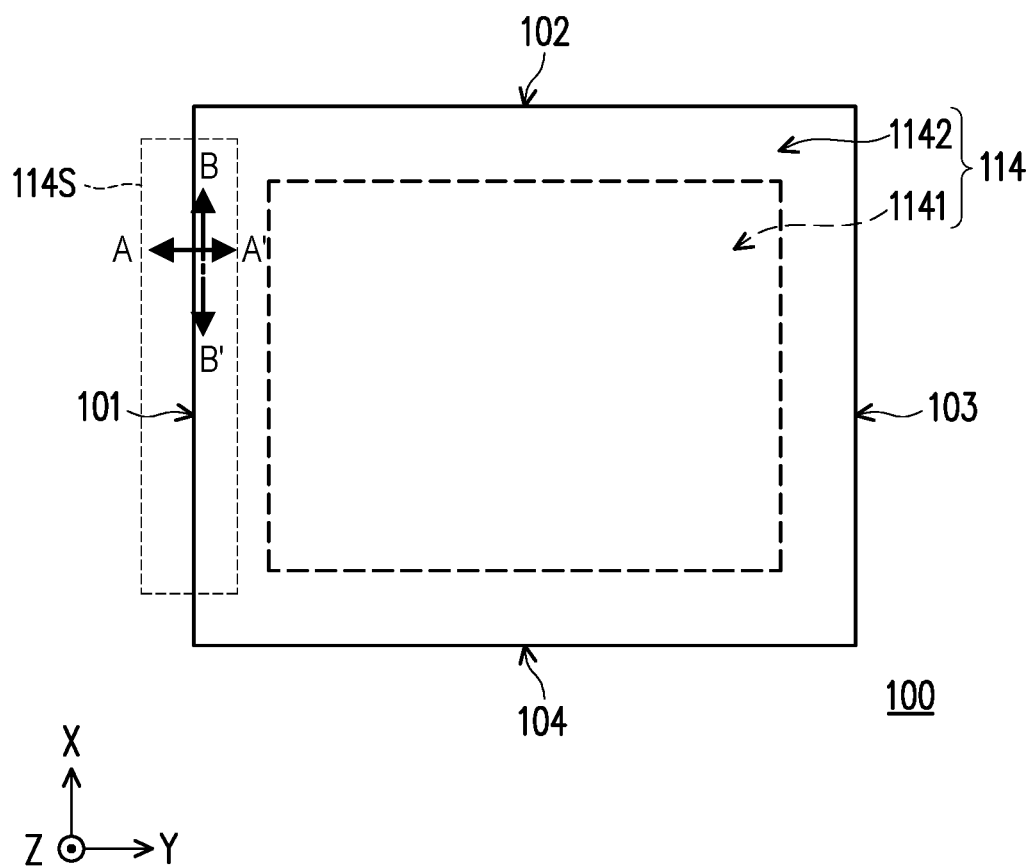
FIG. 1 is a schematic top view of an electronic device according to an embodiment of the disclosure.

The disclosure can be understood by referring to the following detailed description in conjunction with the accompanying drawings. It should be noted that in order to make the reader easy to understand and for the sake of simplicity of the drawings, the multiple drawings in the disclosure only depict a part of the electronic device, and certain elements in the drawings are not drawn according to actual scale. In addition, the number and size of each element in the figure are only for illustration, and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

It should be understood that when an element or film is referred to as being "on" or "connected with" another element or layer, it can be directly on or directly connected with the other element or layer, or exist an intervening element or layer between the two (indirect case). In contrast, when an element is referred to as being "directly on" or "directly connected with" another element or layer, there are no intervening elements or layers present.

Although the terms first, second, third etc. can be used to describe various constituent elements, the constituent elements are not limited by the terms. The term is only used to distinguish a single constituent element from other constituent elements in the specification. The same terms may not be used in the claims, but may be replaced by first, second, third, etc. in the order of element declarations in the claims. Therefore, in the following specification, a first constituent element may be a second constituent element in the claims.

The terms "about", "approximately", and "substantially" generally mean that a feature value is within a range of 20% of a given value, or within 10%, 5%, 3%, 2%, 1%, or 0.5% of a given value. The quantity given in the specification is an approximate quantity, that is, even without specifying "about", "approximately", "substantially", it still implies the meaning of "about", "approximately" and "substantially". In addition, the phrase "in a range from a first value to a second value" indicates the range includes the first value, the second value, and other values in between. In addition, the phrase "in a range from a first value to a second value" indicates the range includes the first value, the second value, and other values in between.

In some embodiments of the present disclosure, the length and width can be measured by using an optical microscope, and the thickness can be measured by a cross-sectional image in an electron microscope, but it is not limited thereto. In addition, there may be a certain error in any two values or directions used for comparison.

In some embodiments of the present disclosure, unless specifically defined otherwise, the terms related to joining and connection, such as "connected" and "interconnected", may refer to two structures being in direct contact, or may refer to two structures not being in direct contact and other structures are provided between the two structures. Moreover, the terms about joining and connecting may include a case where two structures are movable or two structures are fixed. In addition, the term "coupled" includes any direct and indirect electrical connection means.

Although the electronic device in the present disclosure includes a plurality of light emitting elements, it is only exemplary and for the sake of description. The electronic device of the disclosure may include a display device, an antenna device (such as liquid crystal antenna), a sensing device, a lighting device, a touch device, a curved device, a free shape device, a bendable device, flexible device, tiled device or a combination thereof, but is not limited thereto. The electronic device may include light-emitting diode (LED), liquid crystal, fluorescence, phosphor, other suitable materials or a combination thereof, but is not limited thereto. The light emitting diode may include organic light emitting diode (OLED), inorganic light emitting diode such as mini LED, micro LED or quantum dot (QD) light emitting diode (QLED or QDLED), other suitable type of LED or any combination of the above, but is not limited thereto. The display device may also include, for example, a tiled display device, but is not limited thereto. The antenna device may be, for example, a liquid crystal antenna, but is not limited thereto. The antenna device may include, for example, a tiled antenna device, but is not limited thereto. It should be noted that the electronic device can be any combination of the above, but is not limited thereto. The electronic device may have peripheral systems such as a driving system, a control system, a light source system, a shelf system, etc., to support a display device, an antenna device, or a tiled device. Hereinafter, an electronic device will be used to illustrate the content of the disclosure, but the disclosure is not limited thereto.

It will be understood that when an element or layer is referred to as being "(electrically) connected with" another element or layer, it can be directly (electrically) connected with the other element or layer, or intervening elements or layers may be presented. In contrast, when an element is referred to as being "directly (electrically) connected with" another element or layer, there are no intervening elements or layers presented. In contrast, when an element is referred to as being "disposed on" or "formed on" A element, it may be directly disposed on (or formed on) A element, or may be indirectly disposed on (or formed on) A element through other component. In contrast, when an element is referred to as being "disposed between" A element and B element, it may be directly disposed between A element and B element, or may be indirectly disposed between A element and B element through other component.

It should be noted that the following embodiments can be replaced, recombined, and mixed to complete other embodiments without departing from the spirit of the present disclosure.

Reference will now be made in detail to the exemplary embodiments of the disclosure, examples of which are illustrated in the accompanying drawings. Whenever possible, the same reference numerals are used to represent the same or similar parts in the accompanying drawings and description.

Figure 2A:
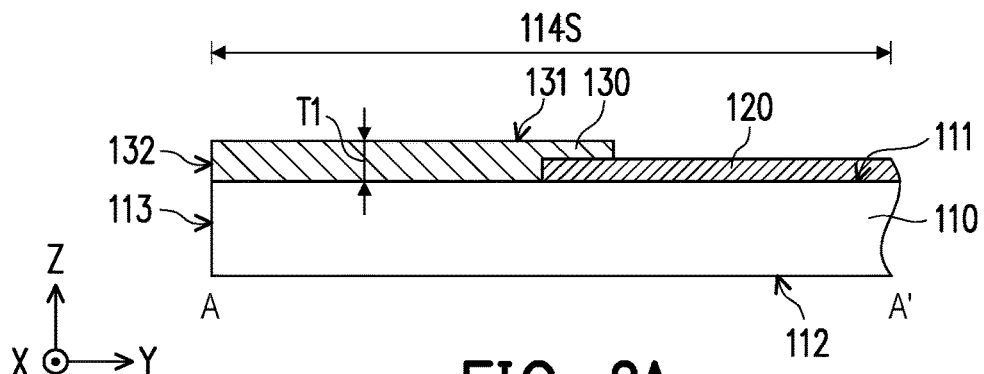
FIG. 2A to FIG. 2C are schematic cross-sectional views of the manufacturing method of the electronic device of FIG. 1.
Figure 2B:
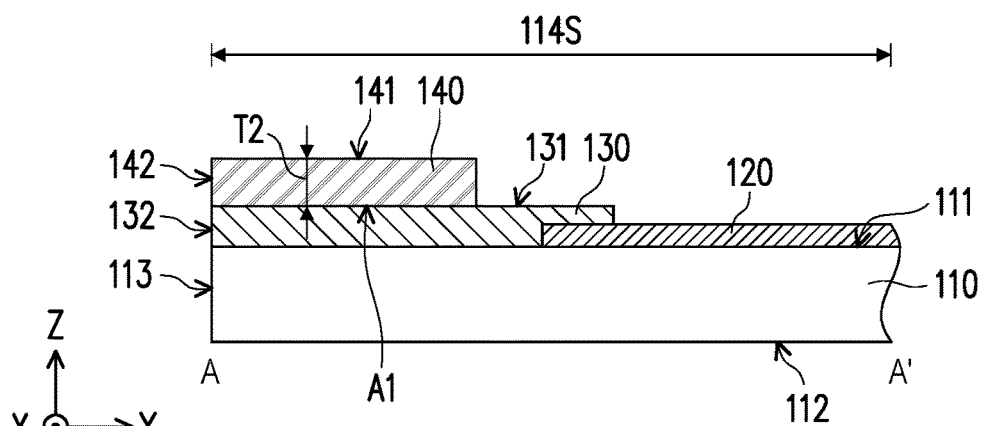
Figure 2C:
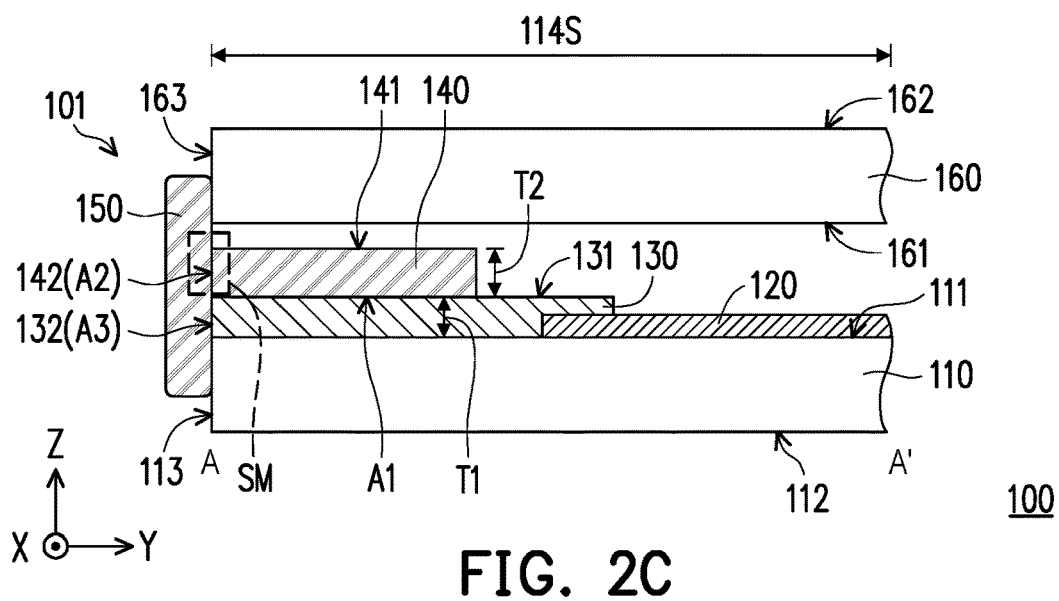
Figure 3A:
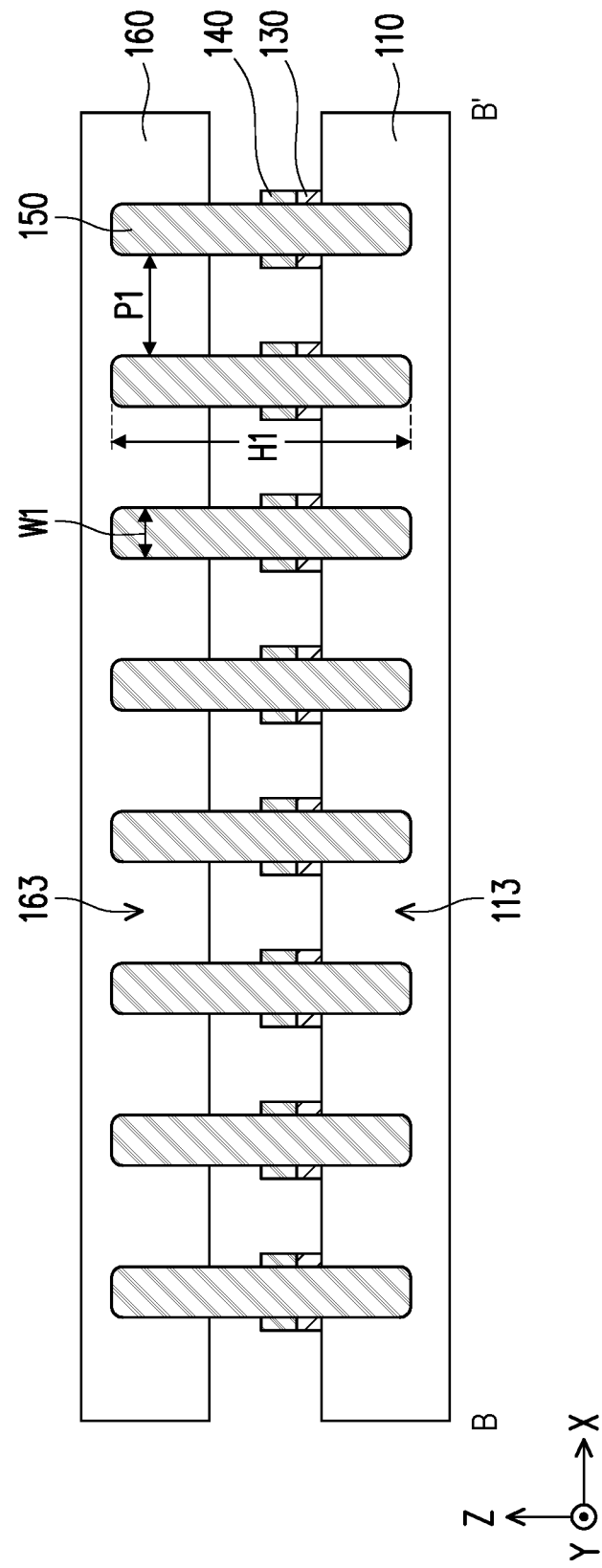
FIG. 3A is a schematic side view of the electronic device of FIG. 1 along the section line B-B'.
Figure 3B:
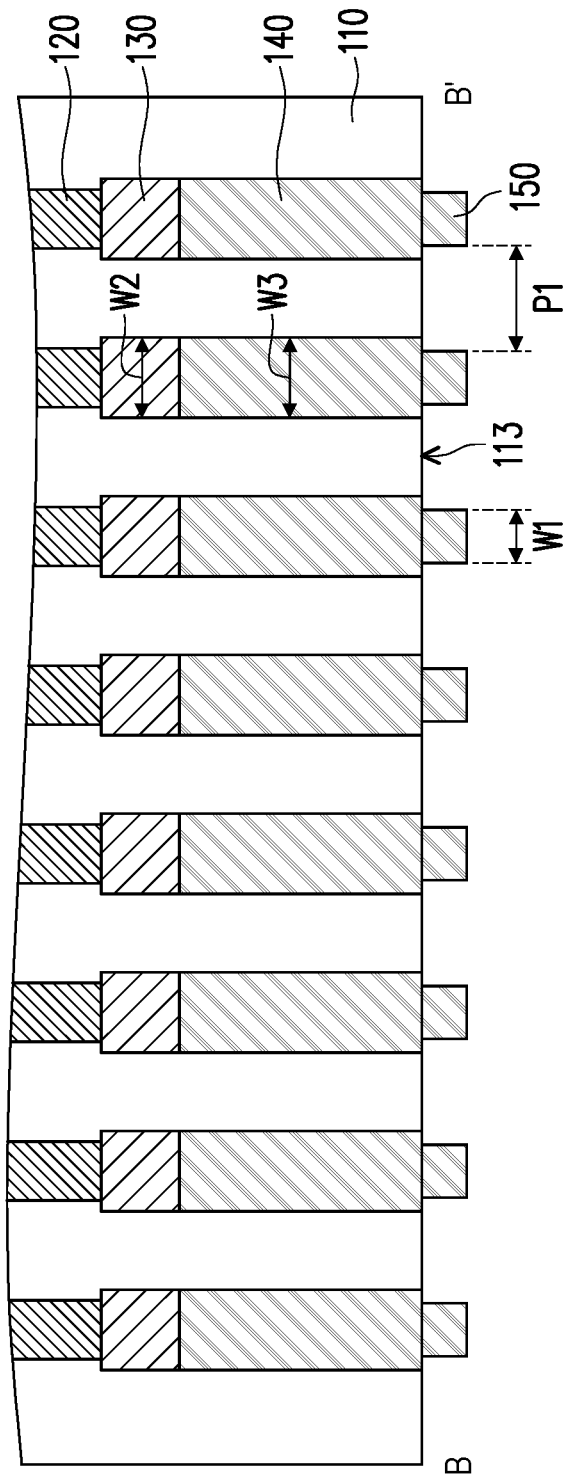
FIG. 3B is a schematic top view of an edge region of the electronic device of FIG. 1.

FIG. 1 is a schematic top view of an electronic device according to an embodiment of the disclosure. FIG. 2A to FIG. 2C are schematic cross-sectional views of the manufacturing method of the electronic device of FIG. 1. FIG. 2C is a schematic cross-sectional view of the electronic device of FIG. 1 along the section line A-A'. FIG. 3A is a schematic side view of the electronic device of FIG. 1 along the section line B-B'. FIG. 3B is a schematic top view of an edge region of the electronic device of FIG. 1. For the sake of clarity and easy description of the drawings, FIG. 1 may omit illustration of several elements.

Referring to FIG. 1 and FIG. 2C simultaneously, the electronic device 100 of the present embodiment includes a first substrate 110, a circuit layer 120, a first wire 130, an auxiliary bonding pad 140, a second wire 150 and a second substrate 160. The first substrate 110 has a top surface 111, a bottom surface 112 and a side surface 113 extending in a dimension different from the top surface 111 and/or the bottom surface 112. The top surface 111 and the bottom surface 112 are opposite to each other, and the side surface 113 connects the top surface 111 and the bottom surface 112. Referring to FIG. 3B, a plurality of first wires 130 are disposed on the top surface 111 of the first substrate 110. For simplicity of explanation, a single first wire 130 will be described in the following descriptions. In addition, referring to FIG. 2C, the second substrate 160 has a top surface 161, a bottom surface 162 and a side surface 163 extending in a dimension different from the top surface 161 and/or the bottom surface 162. The top surface 161 and the bottom surface 162 are opposite to each other, and the side surface 163 connects the top surface 161 and the bottom surface 162. As shown in FIG. 2C, the top surface 111 of the first substrate 110 faces the top surface 161 of the second substrate 160.

In the present embodiment, the electronic device 100 is, for example, a display device without a border or with a slim border, but it is not limited thereto. The electronic device 100 includes a first side 101, a second side 102, a third side 103 and a fourth side 104. The first side 101 and the third side 103 are opposite to each other, and the second side 102 and the fourth side 104 are opposite to each other. The second side 102 is connected between the first side 101 and the third side 103. The electronic device 100 includes a panel region 114. The panel region 114 has a first region 1141 and a second region 1142. The first region 1141 can be a region for displaying. The second region 1142 can be disposed adjacent to the first region 1141. According to some embodiments, the second region 1142 can be disposed around the first region 1141, as shown in FIG. 1, but it is not limited thereto. The panel region 114 can include a side region 114S. The side region 114S can overlap at least one side of the electronic device 100. For example, as shown in FIG. 1, the side region 114 overlaps the first side 101. According to some embodiments, the wirings in the side region 114S can be specially designed, which will be described further in the following.

FIG. 2C is a schematic cross-sectional view of a part of the side region 114S of the electronic device 100 in FIG. 1 along the section line A-A'. Referring to FIG. 1 and FIG. 2C, the wirings in the side region 114S is designed, which includes the first wire 130, the auxiliary bonding pad 140, and the second wire 150. The wirings in the side region 114S can be electrically connected to the circuit layer 120 disposed in the first region 1141. Specifically, a circuit layer 120 disposed in the first region 1141 (display region) can be a display pixel circuit, a display driving circuit, a power unit, a common circuit, a touch sensing circuit, a by-pass wiring, electrostatic discharge protection system, or combinations thereof, but not limited to these. The first wire 130 can be a pad electrically connected to the circuit layer 120, and at least a part of the first wire 130 is disposed between the circuit layer 120 and one of the sides of the electronic device. For example, referring to FIG. 2C, at least a part of the first wire 130 is disposed between the circuit layer 120 and the second wire 150.

For easy of explanation, FIG. 1 only shows one single side region 114S, and the wirings in the side region 114S include the first wire 130, the auxiliary bonding pad 140, and the second wire 150, as mentioned above. According to some embodiments, the electronic device 100 can include more than one side region 114S. For example, although not shown in FIG. 1, the electronic device 100 can include other side region at the second side 102, other side region at the third side 103, and/or other side region at the fourth side 104. The wirings in the other side regions can apply similar or the same design as mentioned above, which can include the first wire 130, the auxiliary bonding pad 140, and the second wire 150, and related descriptions are omitted for simplicity.

Referring to FIG. 2C, the circuit layer 120, the first wire 130 and the auxiliary bonding pad 140 are disposed on the top surface 111 of the first substrate 110. The circuit layer 120 is electrically connected to the first wire 130. The auxiliary bonding pad 140 is connected to and contacts the first wire 130. The second wire 150 is disposed on the side surface 113 of the first substrate 110, and can also be called as a side wiring. In addition, the second wire 150 is connected to and contacts the auxiliary bonding pad 140, and the second wire 150 can be electrically connected to the first wire 130 through the auxiliary bonding pad 140. In the present embodiment, the second wire 150 and the auxiliary bonding pad 140 include at least one same material. The same material can include comprises Ag, Ag alloy, Au, Au alloy, Cu, Cu alloy, graphene, carbon nano tube, or combinations thereof. In the present embodiment, since the second wire 150 and the auxiliary bonding pad 140 include at least one same material, the contact resistance between the second wire 150 and the auxiliary bonding pad 140 can be reduced.

Figure 2D:
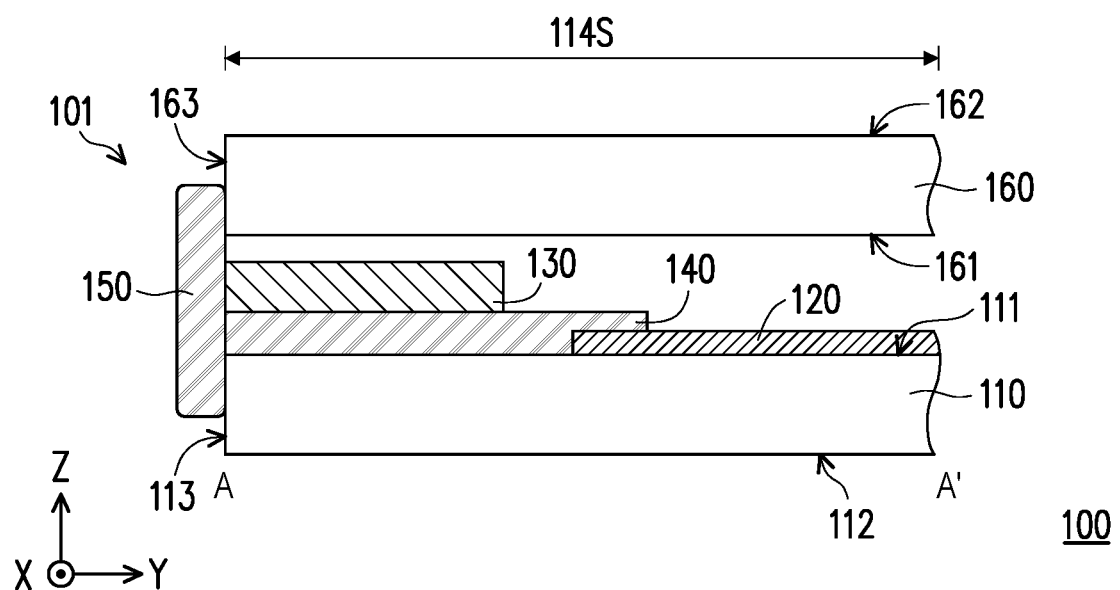
FIG. 2D is schematic cross-sectional views of an electronic device according to another embodiment of the disclosure.

According some embodiments, as shown in FIG. 2C, the auxiliary bonding pad 140 can be disposed on the first wire 130. Alternatively, according to some embodiments, as shown in FIG. 2D, the first wire 130 can be disposed on the auxiliary bonding pad 140.

According to some embodiments, the first region 1141 can be a region for displaying. In addition, image may still be displayed in the second region 1142. That is, according to some embodiments, the second region 1142 can also include a region for displaying. The electronic device 100 can include a display element (not shown) in the region for displaying. The display element can be liquid crystal, micro LED, mini LED, or organic light emitting diode, or combinations thereof, but it is not limited thereto.

In the present embodiment, referring to FIG. 1 and FIG. 2C simultaneously, a direction X, a direction Y and a direction Z are different directions. The direction X and direction Y can define a plane that is parallel to the top surface 111 of the first substrate 110. The direction X may be, for example, roughly an extending direction of the section line B-B', the direction Y may be, for example, roughly an extending direction of the section line A-A', and the direction Z may be, for example, a normal direction of the first substrate 110. The direction Y and the direction Z may be respectively perpendicular to the direction X, and the direction Y may be perpendicular to the direction Z, but not limited thereto.

Next, Referring to FIG. 1 and FIG. 2A to FIG. 2C, the method of manufacturing the second region 1142 of the electronic device 100 of the present embodiment will be described below.

Referring to FIG. 1 and FIG. 2A simultaneously, a first substrate 110 is provided, and a circuit layer 120 and a first wire 130 are formed on the top surface 111 of the first substrate 110 in the second region 1142 of the first substrate 110. Specifically, the circuit layer 120 is first formed on the top surface 111 of the first substrate 110, and the circuit layer 120 is formed to be electrically connected to the circuit (not shown) in the first region 1141.

Next, the first wire 130 is formed on the top surface 111 of the first substrate 110, and the first wire 130 is electrically connected to the circuit layer 120. In some embodiments, the first wire 130 includes an upper surface 131 and a side surface 132. The upper surface 131 is the surface of the first wire 130 away from the first substrate 110, and the side surface 132 is the side surface of the first wire 130 away from the first region 1141. The side surface 132 of the first wire 130 may be aligned with the side surface 113 of the first substrate 110. In the present embodiment, the step of forming the circuit layer 120 (or the first wire 130) includes, for example, forming a metal material layer (not shown) on the top surface 111 of the first substrate 110 by sputtering, evaporation, chemical deposition, or physical deposition, followed by patterning the metal material layer by a photo-lithography process, but it is not limited thereto, so that the metal material layer may be patterned to form the circuit layer 120 (or the first wire 130). The circuit layer 120 and the first wire 130 may be formed by different conductive layers, for example, metal material layers, but the disclosure is not limited thereto. In some embodiments, the circuit layer and the first wire may be formed by the same metal material layer and may be integrally formed to each other.

In the present embodiment, a thickness T1 of the first wire 130 may be in a range of 0.01 micrometer (μm) to 100 μm, or in a range of 1 μm to 50 μm, for example, about 10 micrometer (μm), but it is not limited thereto. The thickness T1 is, for example, the maximum thickness of the first wire 130 measured along the normal direction of the first substrate 110 (the direction Z). In the present embodiment, a material of the circuit layer 120 and a material of the first wire 130 may include Cu, Cu alloy, Al, Al alloy, Mo, Mo alloy, Ti, Ti alloy, ITO (indium tin oxides), or combinations thereof, but it is not limited thereto. In the present embodiment, the first substrate 110 may include a rigid substrate, a flexible substrate or a combination thereof. For example, a material of the first substrate 110 may include glass, quartz, sapphire, ceramic, polycarbonate (PC), polyimide (PI), polyethylene terephthalate (PET), other suitable substrate materials or a combination thereof, but it is not limited thereto.

Then, referring to FIG. 2B, an auxiliary bonding pad 140 is formed on the top surface 111 of the first substrate 110 so that the auxiliary bonding pad 140 may contact the first wire 130. Specifically, the auxiliary bonding pad 140 is formed on the upper surface 131 of the first wire 130, and the auxiliary bonding pad 140 contacts and is connected to the first wire 130. The auxiliary bonding pad 140 may be electrically connected to the circuit layer 120 through the first wire 130. In the present embodiment, the auxiliary bonding pad 140 and the first substrate 110 may be located on two opposite sides of the first wire 130 respectively. The auxiliary bonding pad 140 may cover a part of the upper surface 131 of the first wire 130, but it is not limited thereto. In some embodiments, the auxiliary bonding pad may cover the entire upper surface of the first wire (not shown).

In the present embodiment, the auxiliary bonding pad 140 includes an upper surface 141 and a side surface 142. The upper surface 141 is the surface of the auxiliary bonding pad 140 away from the first substrate 110. The side surface 142 is the side surface of the auxiliary bonding pad 140 away from the first region 1141, and the side surface 142 may be aligned with the side surface 113 of the first substrate 110. In the present embodiment, the step of forming the auxiliary bonding pad 140 includes, for example, first forming a conductive layer (not shown) on the surface of the first wire 130 away from the first substrate 110 by sputtering, evaporation, chemical deposition or physical deposition, and then patterning the conductive layer by a photolithography process to the auxiliary bonding pad 140, but it is not limited thereto.

In the present embodiment, a thickness T2 of the auxiliary bonding pad 140 may be in a range of 0.01 μm to 100 or in a range of 1 μm to 50 for example, less than or equal to 10 μm, but it is not limited thereto. The thickness T2 is, for example, the maximum thickness of the auxiliary bonding pad 140 measured along the normal direction of the first substrate 110 (the direction Z). In the present embodiment, the auxiliary bonding pad 140 and the first wire 130 are formed from different materials. A material of the auxiliary bonding pad 140 may include Ag, Ag alloy, Au, Au alloy, Cu, Cu alloy, graphene, carbon nano tube, or combinations thereof. The auxiliary bonding pad 140 can also include other suitable conductive materials, but it is not limited thereto.

Then, referring to FIG. 2C, the first substrate 110 is assembled with the second substrate 160 by a sealant (not shown) and a second wire 150 is formed on the side surface 113 of the first substrate 110 so that the second wire 150 may contact the auxiliary bonding pad 140. Specifically, different from the cross-sectional view of FIG. 2C, the top view of FIG. 3B show a plurality of circuit layer 120, a plurality of first wire 130 and a plurality of auxiliary bonding pad 140. Referring to FIG. 3A and FIG. 3B, the sealant is first formed on the first substrate 110, so that the second substrate 160 may be disposed on the first substrate 110 through the sealant, wherein the circuit layers 120, the first wires 130, the auxiliary bonding pads 140 and the sealant may be located between the second substrate 160 and the first substrate 110. The second wires 150 are formed on the side surface 113 of the first substrate 110 and on the side surface 163 of the second substrate 160. The second wires 150 may extend from the side surface 113 of the first substrate 110 to the side surface 163 of the second substrate 160, so that the second wires 150 may contact the auxiliary bonding pads 140 and the first wires 130. Then, a heater (such as far infrared rays, air blower, electric heating rod, but it is not limited thereto) is used to perform a point annealing process on the second wire 150 to contact the second wire 150 with the auxiliary bonding pad 140, which may change a metallic bond between the second wire 150 and the auxiliary bonding pad 140. Thereby, a robustness, malleability and ductility between the second wire 150 and the auxiliary bonding pad 140 may be increased, and the contact resistance between the second wire 150 and the auxiliary bonding pad 140 may be reduced. So far, the electronic device 100 of the present embodiment has been manufactured. For easy explanation, a single first wire 130, a single second wire 150, and a single auxiliary bonding pad 140 are described. However, the plurality of the first wires 130, the plurality of the second wires 150, and the plurality of auxiliary bonding pad 140 can be also be applied, and related descriptions will be omitted.

In the present embodiment, there is a first contact area A1 at the contact between the auxiliary bonding pad 140 and the first wire 130, there is a second contact area A2 at the contact between the second wire 150 and the auxiliary bonding pad 140, and there is a third contact area A3 at the contact between the second wire 150 and the first wire 130. The first contact area A1 between the auxiliary bonding pad 140 and the first wire 130 may be larger than the second contact area A2 between the second wire 150 and the auxiliary bonding pad 140, but it is not limited thereto. The first contact area A1 may be larger than the third contact area A3 between the second wire 150 and the first wire 130, but it is not limited thereto. In some embodiments, the second contact area A2 may be larger than the third contact area A3. In the present embodiment, compared with an electronic device without an auxiliary bonding pad (having higher contact resistance problem due to the small contact area between the second wire and the first wire), the first contact area A1 may be larger than the third contact area A3. Thus, by means of providing the auxiliary bonding pad 140, the electronic device 100 of the present embodiment may increase the contact area (the first contact area A1) and reduce the contact resistance.

According to some embodiments, the auxiliary bonding pad 140 and the second wire 150 can be formed by different processes. In the present embodiment, the second wire 150 can be formed by a printing process, ink-jet or dispensing method, but it is not limited thereto. A width W1 of the second wire 150 may be, for example, 30 μm to 50 μm, but it is not limited thereto. A width W2 of the first wire 130 may be, for example, equal to a width W3 of the auxiliary bonding pad 140, but it is not limited thereto. The width W2 of the first wire 130 may be, for example, greater than the width W1 of the second wire 150, but it is not limited thereto. The width W3 of the auxiliary bonding pad 140 may be, for example, greater than the width W1 of the second wire 150, but it is not limited thereto. When a gap between the first substrate 110 and the second substrate 160 is 10 μm to 20 μm, a height H1 of the second wire 150 may be, for example, 0.1 mm to 2.0 mm, but it is not limited thereto. In some embodiments, the height H1 of the second wire 150 may be greater than 2.0 mm. A distance P1 between two adjacent second conductive lines 150 may be, for example, 50 μm to 100 but is not limited thereto. The width W1 is, for example, the maximum width of the second wire 150 measured along the direction X. The width W2 is, for example, the maximum width of the first wire 130 measured along the direction X. The width W3 is, for example, the maximum width of the auxiliary bonding pad 140 measured along the direction X. The height H1 is, for example, the maximum height of the second wire 150 measured along the normal direction of the first substrate 110 (direction Z). The distance P1 is, for example, the maximum distance measured along the direction X between two adjacent second conductive lines 150. In the present embodiment, a material of the auxiliary bonding pad 140 may also include Ag, Ag alloy, Au, Au alloy, Cu, Cu alloy, graphene, carbon nano tube, other suitable conductive materials, or a combination thereto, but it is not limited thereto. In some embodiments, a material of the second wire 150 is different from the material of the first wire 130.

In the present embodiment, since the second wire 150 and the auxiliary bonding pad 140 are respectively formed by different processes, even if the second wire 150 and the auxiliary bonding pad 140 include at least one same material, the second wire 150 and the auxiliary bonding pad 140 is still not integrally formed, and there is an interface SM between the second wire 150 and the auxiliary bonding pad 140. In the present embodiment, for example, an optical microscope (OM), a scanning electron microscope (SEM) or a focused ion beam (FIB) method may be used to structurally distinguish the second wire 150 from the auxiliary bonding pad 140. In the present embodiment, for example, FIB, electron probe microanalyzer (EPMA) or energy dispersive X-ray spectrometer (EDX) may be used to distinguish the material of the second wire 150 from the material of the auxiliary pad 140.

In the present embodiments, since the second wire 150 is disposed on the side surface 113 of the first substrate 110 and the side surface 163 of the second substrate 160, a circuit board (not shown) or another electronic device to be subsequently bonded to the electronic device 100 may be bonded to the second wire 150 disposed on the side surface 113 of the first substrate 110 to achieve a side bonding effect. Therefore, no extra bonding area is required in the second region 1142 of the first substrate 110, such that the width of the border of the electronic device 100 may be reduced or the effect of border free may be achieved.

In short, according to some embodiments, by means of forming the auxiliary bonding pad contacted with the first wire, compared with high contact resistance between the second wire 150 and the first wire 130, since the second wire (side wiring) 150 and the auxiliary bonding pad 140 include at least one same material, the contact resistance between the second wire 150 and the auxiliary bonding pad 140 may be reduced. Thus, contact between the side wiring and the first wire can be improved. According to some embodiments, since the first contact area A1 between the auxiliary bonding pad 140 and the first wire 130 is larger than the third contact area A3 between the second wire 150 and the first wire 130, compared with an electronic device without an auxiliary bonding pad, the electronic device 100 of the present embodiment may increase the contact area and reduce the contact resistance by providing the auxiliary bonding pad 140. Therefore, the electric transmission between the first wire 130 and the second wire 150 (side wiring) is ensured. In addition, by changing the metallic bond between the second wire 150 and the auxiliary bonding pad 140, the contact resistance between the second wire 150 and the auxiliary bonding pad 140 can be reduced.

Other embodiments will be illustrated below. It must be noted that, the following embodiments use the component numbers and parts of the foregoing embodiments, in which the same reference numerals are used to indicate the same or similar components, and the description of the same technical content is omitted. For the description of the omitted parts, reference may be made to the foregoing embodiments, and is not repeated in the following embodiments.

Figure 4:
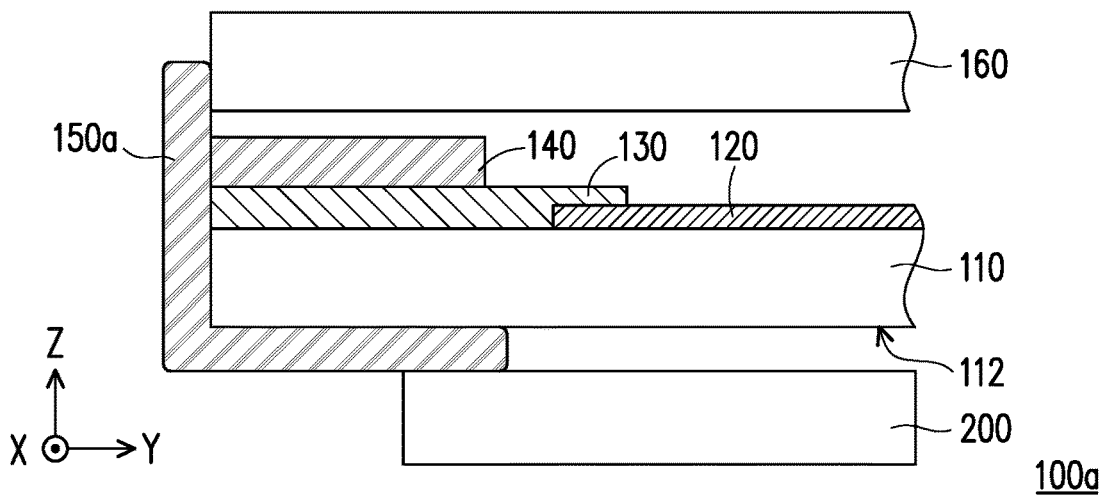
FIG. 4 is a schematic cross-sectional view of an electronic device according to another embodiment of the disclosure.

FIG. 4 is a schematic cross-sectional view of an electronic device according to another embodiment of the disclosure. Referring to FIG. 2C and FIG. 4 at the same time, an electronic device 100a of the present embodiment is substantially similar to the electronic device 100 of FIG. 2C, so the same and similar components in the two embodiments are not repeated here. The electronic device 100a of the present embodiment is different from the electronic device 100 mainly in that: in the electronic device 100a of the present embodiment, a second wire 150a may also be extended and disposed on the bottom surface 112 of the first substrate 110. Thereby, an electric component 200 may be disposed on the bottom surface 112 of the first substrate 110 through the second wire 150a, and the electric component 200 may be electrically connected to the auxiliary bonding pad 140, the first wire 130, the circuit layer 120 and the circuit in the first region 1141 through the second wire 150a. The electric component 200 may include an IC chip, a flexible printed circuit board (FPC) or a printed circuit board assembly (PCBA), but it is not limited thereto. Since the second wire may extend to the bottom surface of the substrate, a circuit board to be subsequently bonded may be disposed to the bottom surface of the substrate through the second wire and does not need to be disposed to the top surface of the opposite substrate, such that the width of the border of the electronic device may be reduced or the effect of border free may be achieved.

Figure 5:
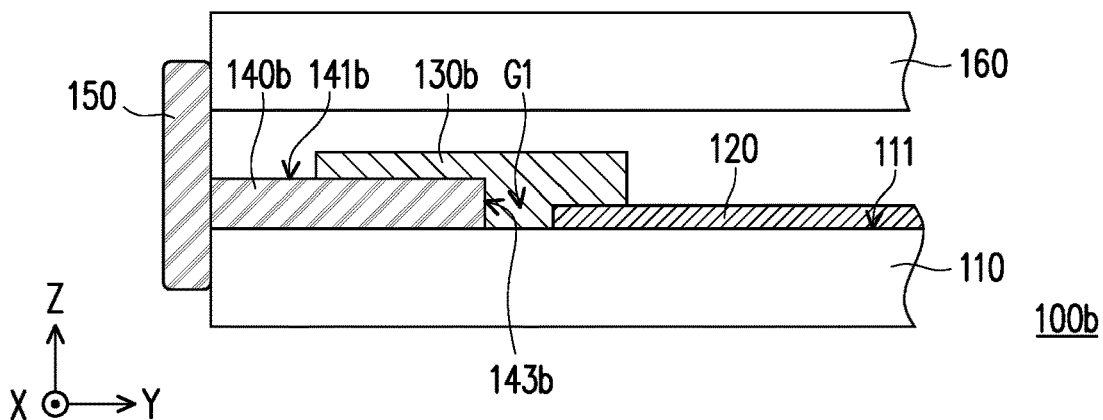
FIG. 5 is a schematic cross-sectional view of an electronic device according to another embodiment of the disclosure.

FIG. 5 is a schematic cross-sectional view of an electronic device according to another embodiment of the disclosure. Referring to FIG. 2C and FIG. 5 at the same time, an electronic device 100b of the present embodiment is substantially similar to the electronic device 100 of FIG. 2C, so the same and similar components in the two embodiments are not repeated here. The electronic device 100b of the present embodiment is different from the electronic device 100 mainly in that: in the electronic device 100b of the present embodiment, an auxiliary bonding pad 140b is disposed between a first wire 130b and the first substrate 110.

Specifically, referring to FIG. 5, in the electronic device 100b of the present embodiment, the auxiliary bonding pad 140b and the circuit layer 120 are respectively formed on the top surface 111 of the first substrate 110, so that there is a gap G1 between the auxiliary bonding pad 140b and the circuit layer 120. Then, the first wire 130b is formed on the auxiliary bonding pad 140b and the circuit layer 120, and the first wire 130b is filled in the gap G1 between the auxiliary bonding pad 140b and the circuit layer 120, so that the auxiliary bonding pad 140b may be electrically connected through the first wire 130b. That is, the first wire 130b may be disposed on the upper surface 141b of the auxiliary bonding pad 140b and a side surface 143b of the auxiliary bonding pad 140b, wherein the side surface 143b is a side surface away from the second wire 150.

In the present embodiment, the first wire 130b may cover part of the upper surface 141b of the auxiliary bonding pad 140b, but it is not limited thereto. In some embodiments, the first wire may cover all the upper surfaces of the auxiliary bonding pads (not shown).

Figure 6:
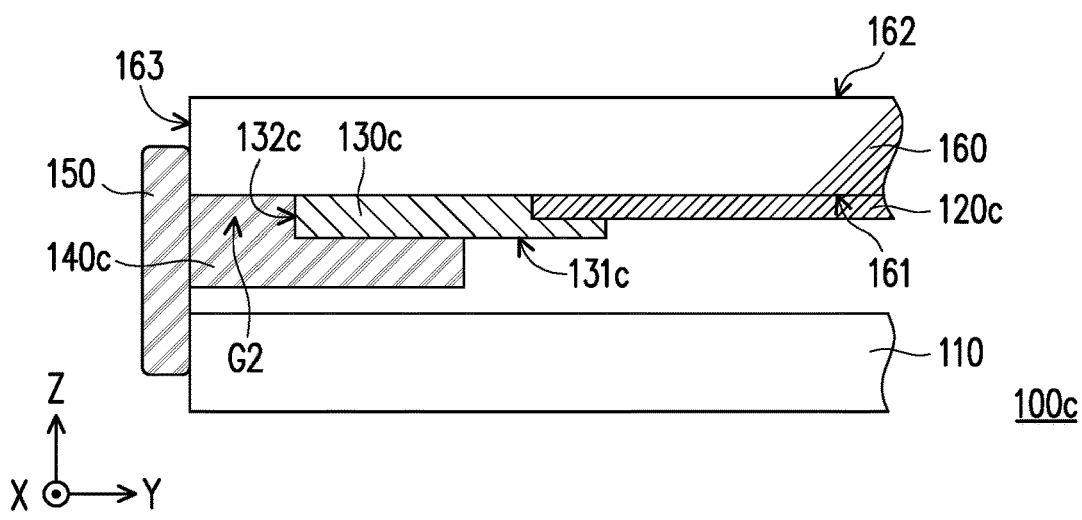
FIG. 6 is a schematic cross-sectional view of an electronic device according to another embodiment of the disclosure.

FIG. 6 is a schematic cross-sectional view of an electronic device according to another embodiment of the disclosure. Referring to FIG. 2C and FIG. 6 at the same time, an electronic device 100c of the present embodiment is substantially similar to the electronic device 100 of FIG. 2C, so the same and similar components in the two embodiments are not repeated here. The electronic device 100c of the present embodiment is different from the electronic device 100 mainly in that: in the electronic device 100c of the present embodiment, a circuit layer 120c, a first wire 130c and an auxiliary bonding pad 140c are disposed on the second substrate 160, and a side surface 132c of the first wire 130c is not aligned with the side surface 163 of the second substrate 160.

Specifically, referring to FIG. 6, in the electronic device 100c of the present embodiment, there is a gap G2 between the side surface 132c of the first wire 130c and the second wire 150. The auxiliary bonding pad 140c is disposed on an upper surface 131c of the first wire 130c (that is, a surface of the first wire 130c away from the second substrate 160, and is disposed in the gap G2 between the first wire 130c and the second wire 150. That is, the auxiliary bonding pad 140c is disposed on the upper surface 131c and the side surface 132c of the first wire 130c (that is, a side surface adjacent to the second wire 150). Therefore, the second wire 150 may be electrically connected to the first wire 130c and the circuit layer 120c through the auxiliary bonding pad 140c. In the present embodiment, the circuit layer 120c may be electrically connected to circuits (not shown) in the first region 1141, such as touch sensor circuits, but it is not limited thereto.

Figure 7A:
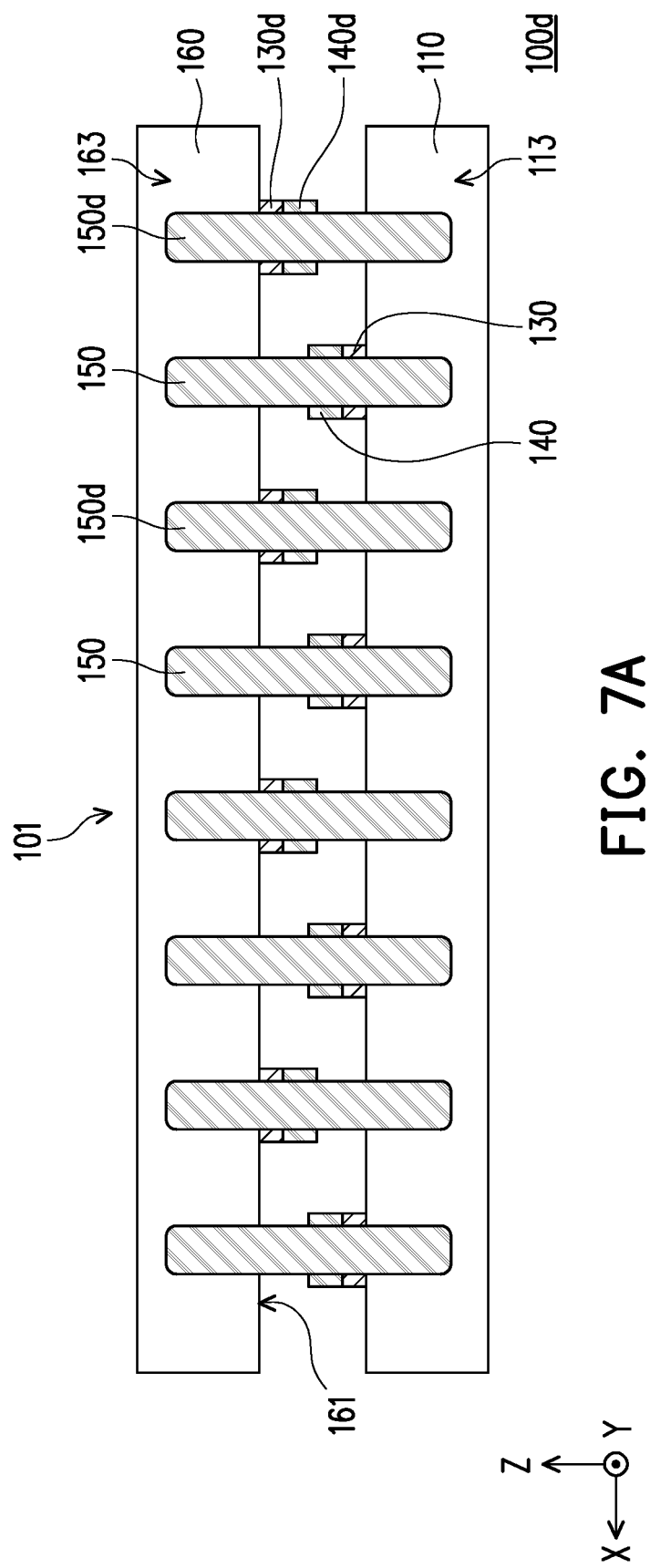
FIG. 7A is a schematic cross-sectional view of an electronic device according to another embodiment of the disclosure.

FIG. 7A is a schematic side view of an electronic device according to another embodiment of the disclosure. Referring to FIG. 3A and FIG. 7A at the same time, an electronic device 100d of the present embodiment is substantially similar to the electronic device 100 of FIG. 3A, so the same and similar components in the two embodiments are not repeated here. The electronic device 100d of the present embodiment is different from the electronic device 100 mainly in that: the electronic device 100d of the present embodiment further includes a first wire 130d (another first wire), an auxiliary bonding pad 140d (another auxiliary bonding pad), and a second wire 150d (another second wire).

Specifically, referring to FIG. 7A, in the method of manufacturing the electronic device 100d of the present embodiment, the method further includes the following steps: providing an second substrate 160, wherein the second substrate 160 is oppositely disposed on the first substrate 110; forming a first wire 130d on a top surface 161 of the second substrate 160 adjacent to the first substrate 110; forming an auxiliary bonding pad 140d on the top surface 161 of the second substrate 160, wherein the auxiliary bonding pad 140d contacts the first wire 130d; forming a second wire 150d on the side surface 163 of the second substrate 160, so that the second wire 150d contacts the auxiliary bonding pad 140d. According to this embodiments, the electronic 100d includes a second substrate 160, oppositely disposed on the first substrate 110; another first wire 130d disposed on a top surface 161 of the second substrate 160, the top surface of the first substrate facing the top surface of the second substrate; another auxiliary bonding pad 140d disposed on the top surface of the second substrate, wherein the another auxiliary bonding pad contacts the another first wire; and another second wire 150d disposed on a side surface 163 of the second substrate 160. The another second wire 150d contacts the another auxiliary bonding pad 140d.

Referring to FIG. 7A, a plurality of first wires 130d are disposed on the top surface 161 of the second substrate 160. For simplicity of explanation, a single first wire 130d will be described in the following descriptions. According to some embodiment, the second wire 150 extends from the side surface 113 of the first substrate 110 to the side surface 163 of the second substrate 160, the second wire 150d extends from the side surface 163 of the second substrate 160 to the side surface 113 of the first substrate 110. The second wire 150 and the second wire 150d can be arranged in a staggered manner, for example. In the present embodiment, although the second wire 150 and the second wire 150d may be arranged in the staggered manner, the disclosure does not limit the arrangement of the second wire 150 and the second wire 150d, as long as the second wire 150 and the second wire 150d may contact the auxiliary bonding pad 140 and the auxiliary bonding pad 140d, respectively.

In the present embodiment, the second wire 150 contacts and is electrically connected to the auxiliary bonding pad 140 and the first wire 130, but the second wire 150 does not contact the auxiliary bonding pad 140d and the first wire 130d. The second wire 150d contacts and is electrically connected to the auxiliary bonding pad 140d and the first wire 130d, but the second wire 150d does not contact the auxiliary bonding pad 140 and the first wire 130.

Referring to FIG. 7A, in the present embodiment, since the side surface 113 of the first substrate 110 and the side surface 163 of the second substrate 160 are both located on the same side of the electronic device 100d, the second wire 150 and the second wire 150d are also located on the same side of the electronic device 100d. For example, the second wire 150 and the second wire 150d are both located on a first side 101 of the electronic device 100d, wherein the first side 101 is extended on a plane formed by the direction X and the direction Z. However, the present disclosure does not limit the second wire 150 and the second wire 150d to be arranged on the same side of the electronic device 100d. That is, in other embodiments, the second wire 150 and the second wire 150d' may also be located on different sides of the electronic device 100d', as shown in FIG. 7B.

Figure 7B:
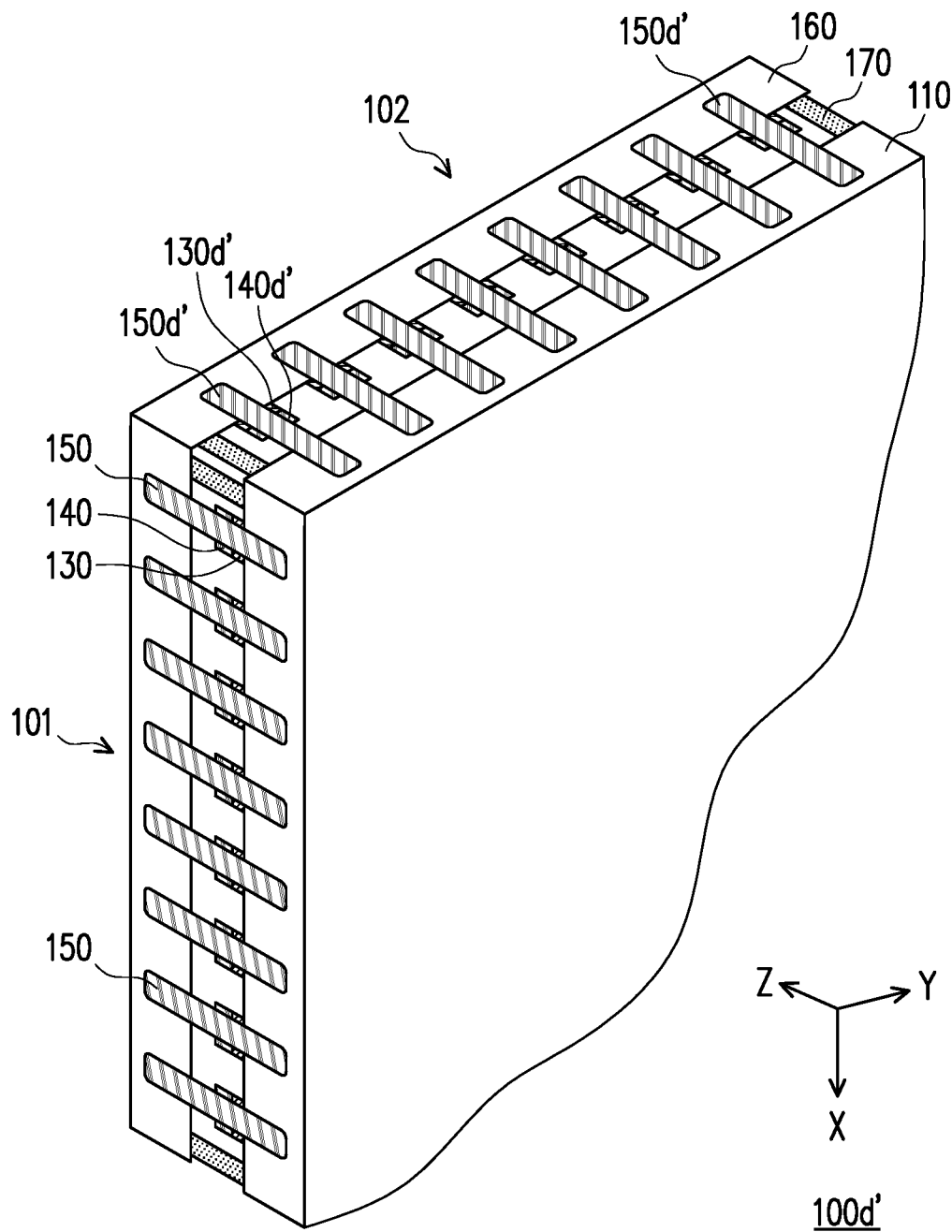
FIG. 7B is a schematic three-dimensional view of an electronic device according to another embodiment of the disclosure.

FIG. 7B is a schematic three-dimensional view of an electronic device according to another embodiment of the disclosure. Referring to FIG. 7A and FIG. 7B at the same time, an electronic device 100d' of the present embodiment is substantially similar to the electronic device 100d of FIG. 7A, so the same and similar components in the two embodiments are not repeated here. The electronic device 100d' of the present embodiment is different from the electronic device 100d mainly in that: in the electronic device 100d' of the present embodiment, the second wire 150 and a second wire 150d' may be located on different sides of the electronic device 100d'.

Specifically, referring to FIG. 7B, in the electronic device 100d' of the present embodiment, the second wire 150 is located on a first side 101 of the electronic device 100d' and the second wire 150d' is located on a second side 102 of the electronic device 100d'. The first side 101 and the second side 102 are different sides of the electronic device 100d'.

For example, the first side 101 of the electronic device 100d' is extended on a plane formed by the direction X and the direction Z, and the second side 102 of the electronic device 100d' is extended on a plane formed by the direction Y and the direction Z. In the present embodiment, the second wire 150 contacts the auxiliary bonding pad 140 and the first wire 130, but does not contact the auxiliary bonding pad 140d'. The second wire 150d' contacts the auxiliary bonding pad 140d' and the first wire 130d', but does not contact the auxiliary bonding pad 140.

Figure 8A:
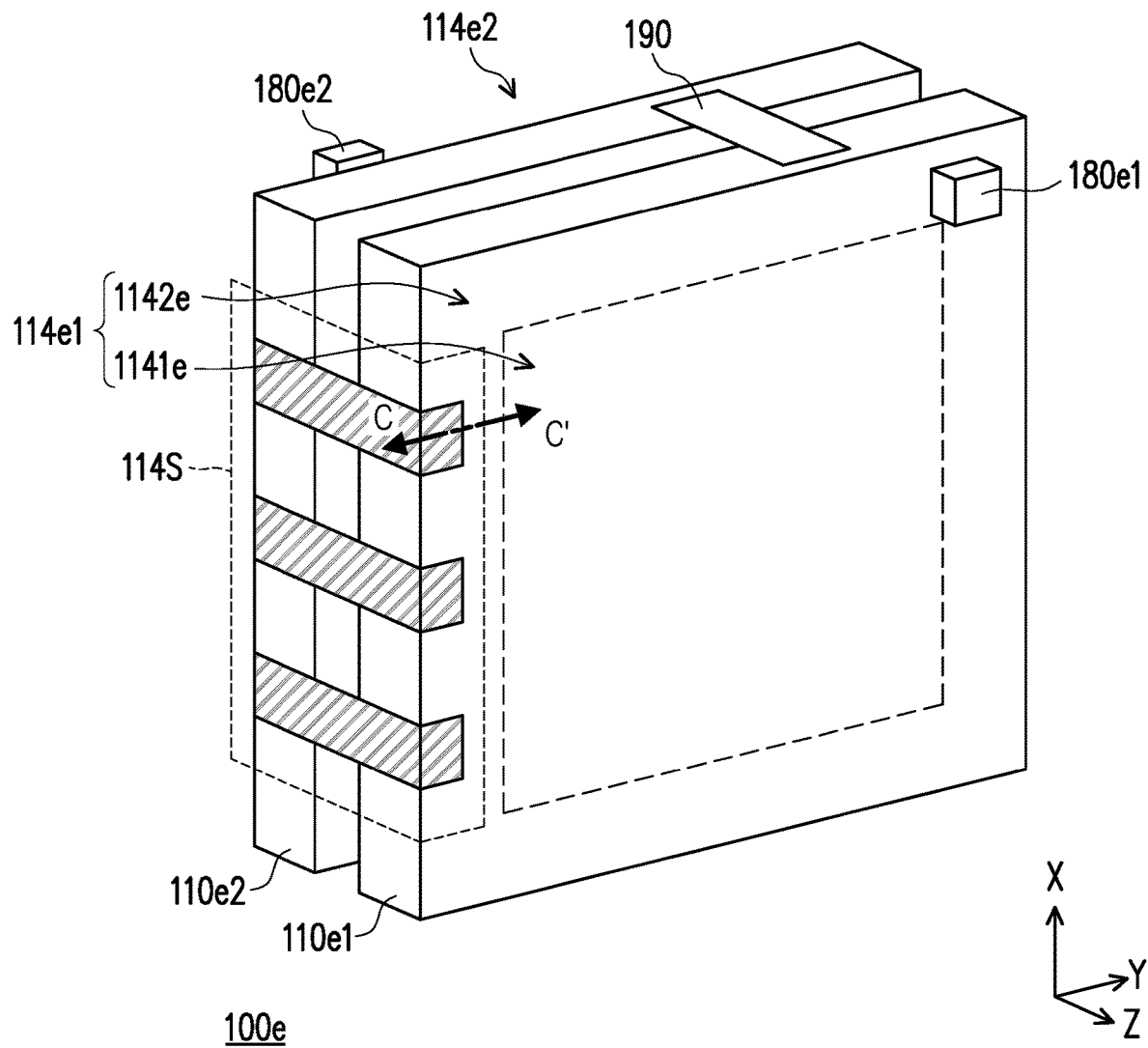
FIG. 8A is a schematic three-dimensional view of an electronic device according to another embodiment of the disclosure.
Figure 8B:
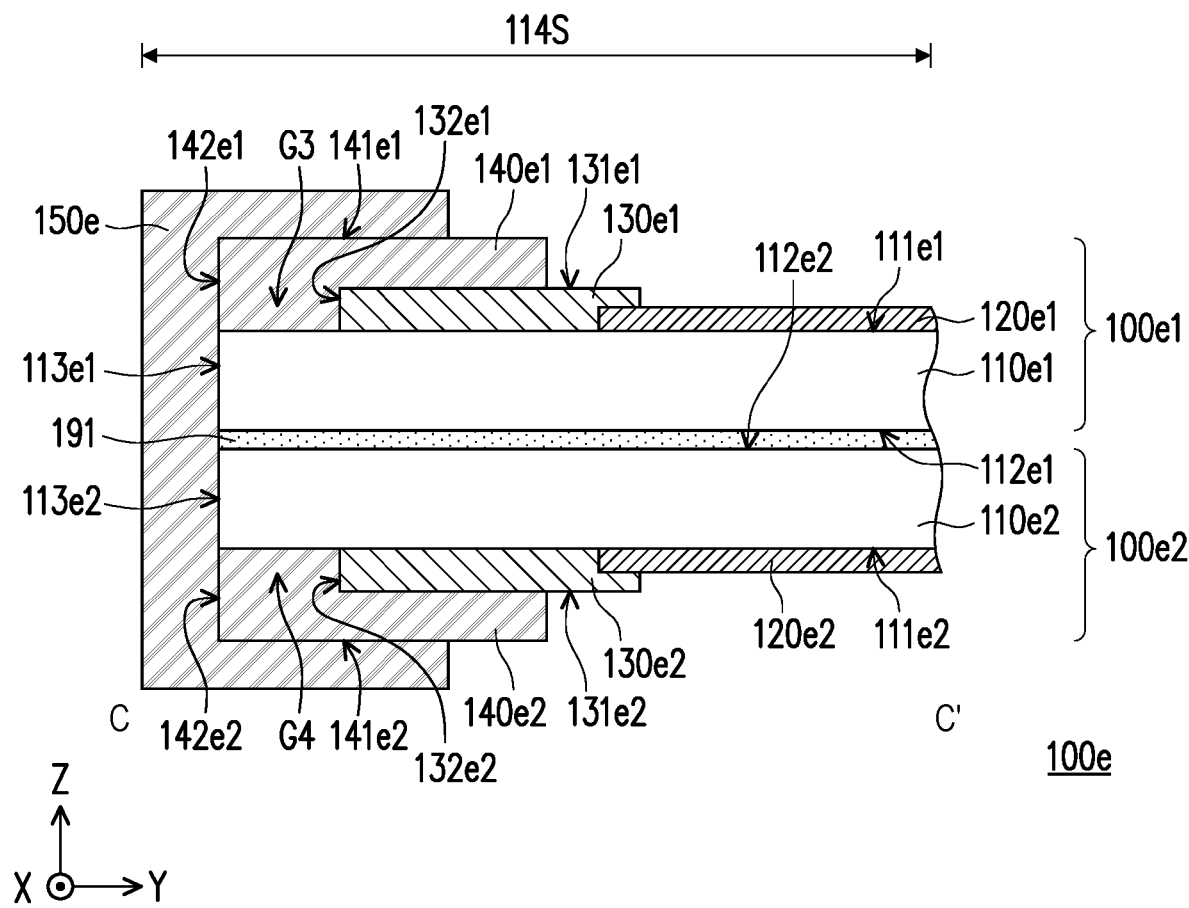
FIG. 8B is a schematic cross-sectional view of the electronic device of FIG. 8A along the section line C-C'.

FIG. 8A is a schematic three-dimensional view of an electronic device according to another embodiment of the disclosure. FIG. 8B is a schematic cross-sectional view of the electronic device of FIG. 8A along the section line C-C'. For the sake of clarity and easy description of the drawings, FIG. 8A may omit illustration of several elements. Referring to FIG. 2C and FIGS. 8A-8B at the same time, an electronic device 100e of the present embodiment is substantially similar to the electronic device 100 of FIG. 2C, so the same and similar components in the two embodiments are not repeated here. The electronic device 100e of the present embodiment is different from the electronic device 100 mainly in that: the electronic device 100e of the present embodiment is a dual side display device.

Specifically, referring to FIGS. 8A and 8B, the wirings in the side region 114S is specially designed, which includes a first wire 130e1, an auxiliary bonding pad 140e1, another first wire 130e2, another auxiliary bonding pad 140e2, and a second wire 150e electrically connected between the auxiliary bonding pad 140e1 and the another auxiliary bonding pad 140e2. Specifically, the electronic device 100e of the present embodiment includes a display panel 100e1, a display panel 100e2, a connection circuit 190 and an adhesive layer 191. The display panel 100e1 includes a substrate 110e1, a circuit layer 120e1, a first wire 130e1, an auxiliary bonding pad 140e1 and a camera 180e1. The display panel 100e2 includes a substrate 110e2, a circuit layer 120e2, a first wire 130e2, an auxiliary bonding pad 140e2 and a camera 180e2. The substrate 110e1 of the display panel 100e1 and the substrate 110e2 of the display panel 100e2 are connected and fixed together by the adhesive layer 191. A bottom surface 112e1 of the substrate 110e1 is adjacent to a second surface 112e2 of the substrate 110e2 and away from a first surface 111e2 of the substrate 110e2. The connecting circuit 190 connects the display panel 100e1 and the display panel 100e2, and may be used to transmit signals between the display panel 100e1 and the display panel 100e2. According to some embodiments, the connection circuit 190 may be, for example, a flexible circuit board or a printed circuit board assembly. According to some embodiments, the connection circuit 190 can include the second wire (side wiring) 150e, but it is not limited thereto.

More specifically, the panel region 114e1 of the display panel 100e1 has a first region 1141e and a second region 1142e. The second region 1142e can be disposed adjacent to the first region 1141e. According to some embodiments, the display region 1142e can be located around the first region 1141e, as shown in FIG. 8A, but it is not limited thereto. In the present embodiment, FIG. 8B is a schematic cross-sectional view of the second region 1142e of the panel region 114e1 of the display panel 100e1 of FIG. 8A along the section line C-C'. Referring to FIG. 8B, the circuit layer 120e1, the first wire 130e1, and the auxiliary bonding pad 140e1 are disposed on a top surface 111e1 of the substrate 110e1 (that is, a surface of the substrate 110e1 away from the substrate 110e2). The circuit layer 120e1 is electrically connected to the first wire 130e1. The auxiliary bonding pad 140e1 is disposed on an upper surface 131e1 of the first wire 130e1 (that is, a surface of the first wire 130e1 away from the substrate 110e1), and is disposed in a gap G3 between the first wire 130e1 and the second wire 150e. That is, the auxiliary bonding pad 140e1 may be disposed on the upper surface 131e1 and a side surface 132e1 of the first wire 130e1 (that is, a side surface of the first wire 130e1 adjacent to the second wire 150e).

In the present embodiment, the circuit layer 120e2, the first wire 130e2 and the auxiliary bonding pad 140e2 are disposed on the first surface 111e2 of the substrate 110e2 (that is, a surface of the substrate 110e2 away from the adhesive layer 191). The circuit layer 120e2 is electrically connected to the first wire 130e2. The auxiliary bonding pad 140e2 is disposed on an upper surface 131e2 of the first wire 130e2 (that is, a surface of the first wire 130e2 away from the substrate 110e2), and is disposed in a gap G4 between the first wire 130e2 and the second wire 150e. That is, the auxiliary bonding pad 140e2 may be provided on the upper surface 131e2 and a side surface 132e2 of the first wire 130e2 (that is, a side surface of the first wire 130e2 adjacent to the second wire 150e).

In the present embodiment, the second wire 150e is disposed on a side surface 113e1 of the substrate 110e1, and extends along a side surface 142e1 of the auxiliary bonding pad 140e1 to an upper surface 141e1 of the auxiliary bonding pad 140e1 away from the substrate 110e1. In addition, the second wire 150e is also disposed on a side surface 113e2 of the substrate 110e2 and extends along a side surface 142e2 of the auxiliary bonding pad 140e2 to an upper surface 141e2 of the auxiliary bonding pad 140e2 away from the substrate 110e2. The second wire 150e is connected to and contacts the auxiliary bonding pad 140e1 and the auxiliary bonding pad 140e2. The second wire 150e may be electrically connected to the first wire 130e1 and the circuit layer 120e1 through the auxiliary bonding pad 140e1, and the second wire 150e may also be electrically connected to the first wire 130e2 and the circuit layer 120e2 through the auxiliary bonding pad 140e2. In other words, since the second wire 150e may be electrically connected the first wire 130e1 and the first wire 130e2 (or the circuit layer 120e1 and the circuit layer 120e2), the second wire 150e may be regarded as a connection circuit and may be used to transmit signals between the display panel 100e1 and the display panel 100e2.

For example, the camera 180e1 disposed in the panel region 114e1 of the display panel 100e1 may transmit a captured image to the display panel 100e2 through the second wire 150e, and the image captured by the camera 180e1 is displayed on the display panel 100e2. Similarly, the camera 180e2 disposed in the panel region 114e2 of the display panel 100e2 may transmit a captured image to the display panel 100e1 through the second wire 150e, and the image captured by the camera 180e2 is displayed on the display panel 100e1. According to some embodiment, the electronic device 100e may not include the camera 180e1 and the camera 180e2.

In addition, a method of manufacturing the electronic device 100e of the present embodiment includes the following steps: providing the substrate 110e1; forming the first wire 130e1 on the top surface 111e1 of the substrate 110e1; forming the auxiliary bonding pad 140e1 on the top surface 111e1 of the substrate 110e1, so that the auxiliary bonding pad 140e1 contacts the first wire 130e1; providing the substrate 110e2, wherein the substrate 110e2 may be disposed on the bottom surface 112e1 of the substrate 110e1; forming the first wire 130e2 on the first surface 111e2 of the substrate 110e2 away from the substrate 110e1; forming the auxiliary bonding pad 140e2 is on the first surface 111e2 of the substrate 110e2 away from the substrate 110e1, wherein the auxiliary bonding pad 140e2 contacts the first wire 130e2; forming the second wire 150e on the side surface 113e1 of the substrate 110e1 and the side surface 113e2 of the substrate 110e2 so that the second wire 150e contacts the auxiliary bonding pad 140e1 and the auxiliary bonding pad 140e2; forming the second wire 150e on the upper surface 141e1 of the auxiliary bonding pad 140e1 away from the substrate 110e1 and the upper surface 141e2 of the auxiliary bonding pad 140e2 away from the substrate 110e2.

Figure 9:
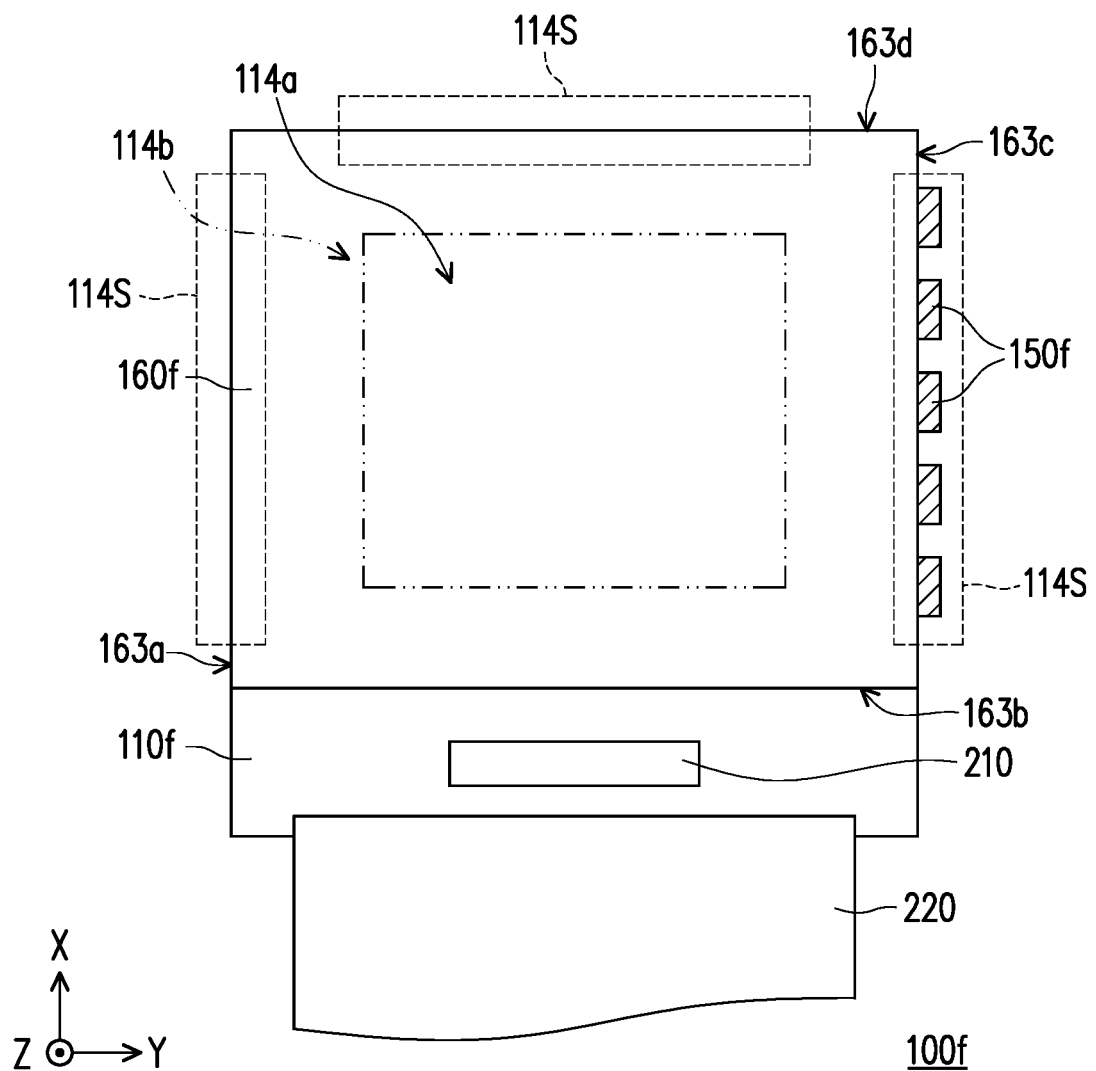
FIG. 9 is a schematic top view of an electronic device according to another embodiment of the disclosure.

FIG. 9 is a schematic top view of an electronic device according to another embodiment of the disclosure. Referring to FIG. 1, FIG. 2C and FIG. 9 at the same time, an electronic device 100f of the present embodiment is substantially similar to the electronic device 100 of FIG. 1 and FIG. 2C, so the same and similar components in the two embodiments are not repeated here. The electronic device 100f of the present embodiment is different from the electronic device 100 mainly in that: in the electronic device 100f of the present embodiment, second wires 150f are disposed on one of side surfaces of a second substrate 160f.

Specifically, in the present embodiment, the electronic device 100f includes a first substrate 110f, the second substrate 160f, a chip 210 and a flexible printed circuit board (FPC) 220. The second substrate 160f is assembled with the first substrate 110f. The chip 210 and the FPC 220 are disposed on the first substrate 110f.

In the present embodiment, the second substrate 160f include a first side surface 163a, a second side surface 163b, a third side surface 163c, a fourth side surface 163d and a plurality of side regions 114S. The first side surface 163a and the third side surface 163c are opposite to each other, and the second side surface 163b and the fourth side surface 163d are opposite to each other. The second substrate 160f includes a display region 114a and a non-display region 114b. The non-display region 114b is located around the display region 114a. The non-display region 114b is distributed along the first side surface 163a, the second side surface 163b, the third side surface 163c and the fourth side surface 163d of the second substrate 160f. The chip 210 and the FPC 220 are adjacent to the third side surface 163c. The side regions 114 may respectively overlap the first side surface 163a, the third side surface 163c and the fourth side surface 163d of the second substrate 160f, but not overlap the second side surface 163b. The second wires 150f are disposed on the third side surface 163c of the second substrate 160f and a corresponding side surface (not shown) of the first substrate 110f, such that the components on the second substrate 160f may be electrically to the components on the first substrate 110f through the second wires 150f. In some embodiments, the second wires 150f may also be disposed on the first side surface 163a and the fourth side surface 163d, but not the second side surface 163b since the corresponding side of the first substrate 110f is not aligned with the second side surface 163b.

Figure 10:
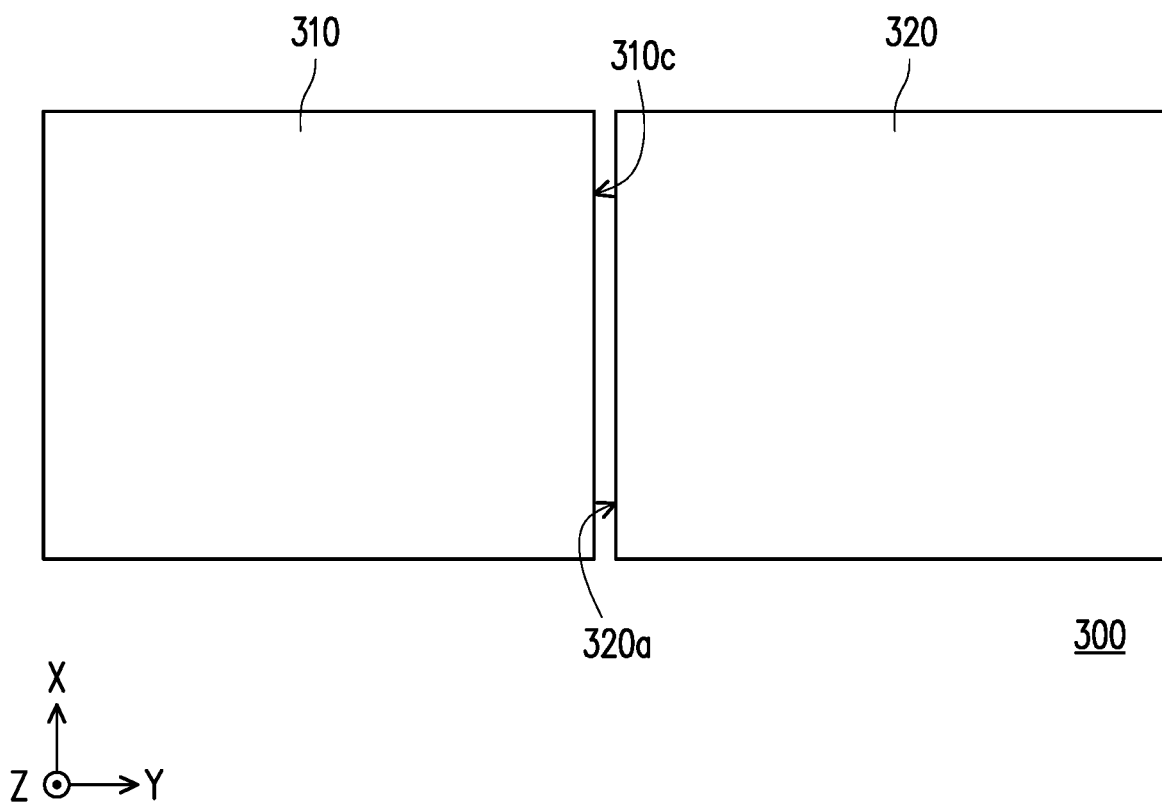
FIG. 10 is a schematic top view of an electronic device according to another embodiment of the disclosure.

FIG. 10 is a schematic top view of an electronic device according to another embodiment of the disclosure. Referring to FIG. 1 and FIG. 10 at the same time, an electronic device 300 of the present embodiment is substantially similar to the electronic device 100 of FIG. 1, so the same and similar components in the two embodiments are not repeated here. The electronic device 300 of the present embodiment is different from the electronic device 100 mainly in that: the electronic device 300 is a tiled display device, which includes a first panel 310 and a second panel 320.

Specifically, the first panel 310 and the second panel 320 may be one of the previous electronic devices. In the present embodiment, a third side 310c of the first panel 310 may be tiled with a first side 320a of the second panel 320. The third side 310c of the first panel 310 is a side of the first panel 310 adjacent to the second panel 320. The first side 230a of the second panel 320 is a side of the second panel 320 adjacent to the first panel 310. The auxiliary pads (not shown) and the second wires (not shown) are disposed adjacent to the third side 110c of the first panel 310 and the first side 230a of the second panel 320.

Figure 11:
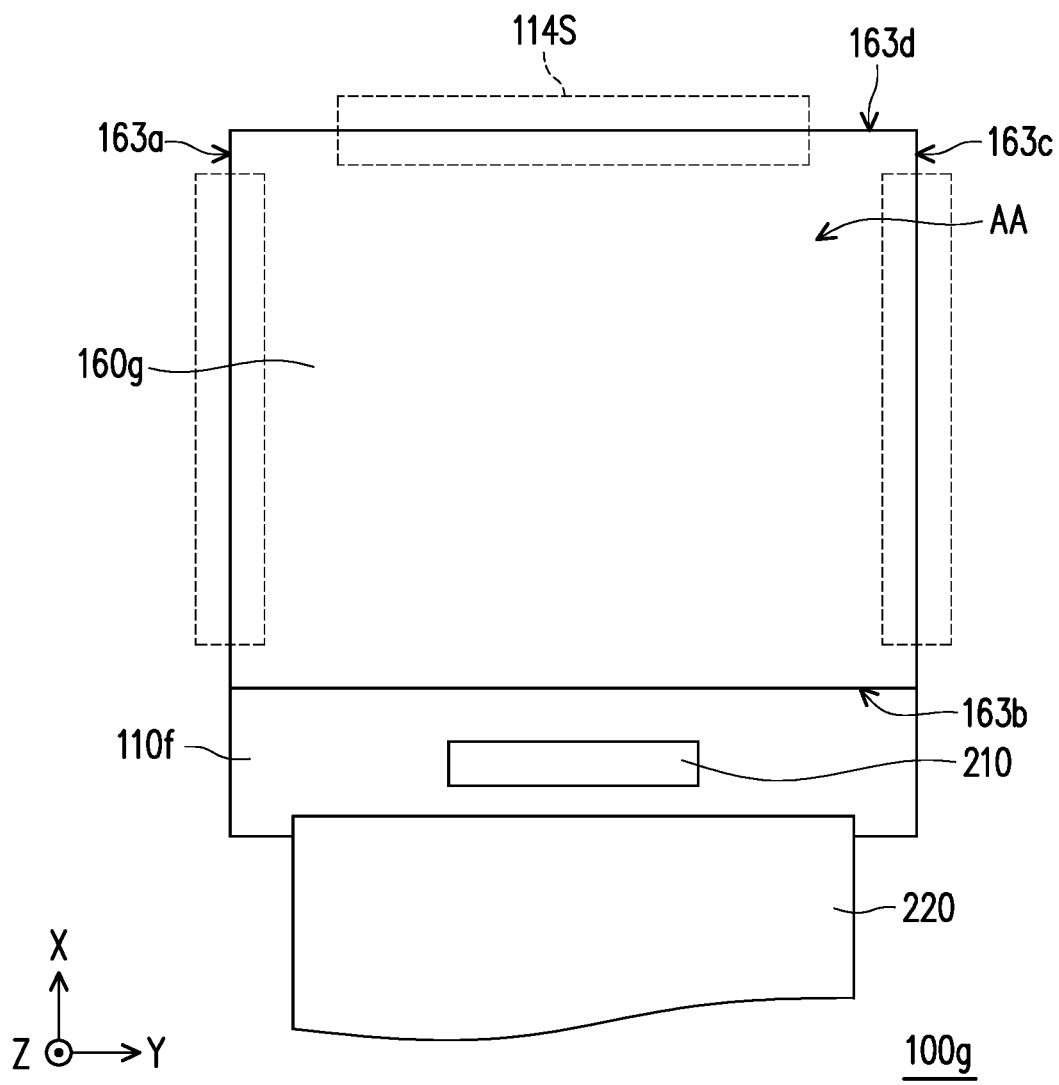
FIG. 11 is a schematic top view of an electronic device according to another embodiment of the disclosure.

FIG. 11 is a schematic top view of an electronic device according to another embodiment of the disclosure. Referring to FIG. 9 and FIG. 11 at the same time, an electronic device 100g of the present embodiment is substantially similar to the electronic device 100f of FIG. 9, so the same and similar components in the two embodiments are not repeated here. The electronic device 100g of the present embodiment is different from the electronic device 100f mainly in that: a second substrate 160g of the electronic device 100g of the present embodiment includes a display region AA and a plurality of side regions 114S. Specifically, the side regions 114 may respectively overlap a first side surface 163a, a third side surface 163c and a fourth side surface 163d of the second substrate 160g, but not overlap a second side surface 163b. In some embodiments, a second substrate of the electronic device may also include one side region, which overlap the first side surface, the third side surface or the fourth side surface.

Figure 12:
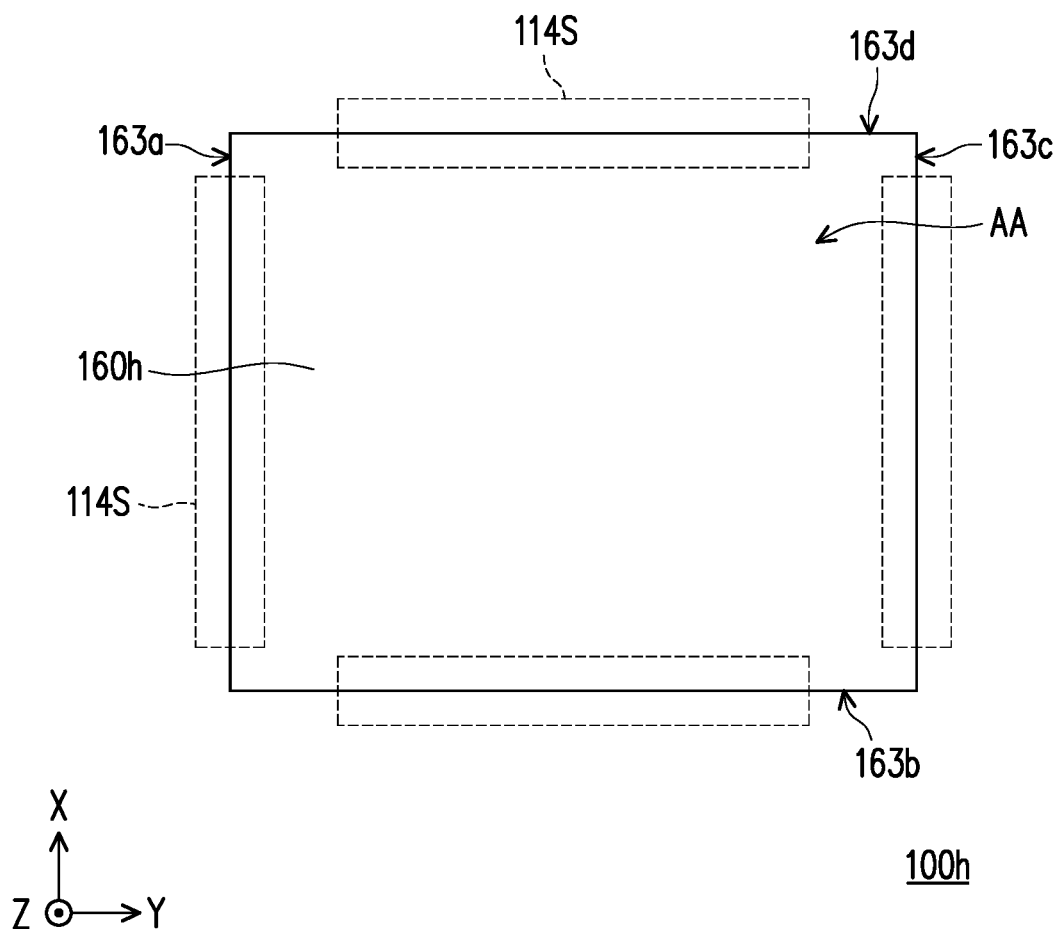
FIG. 12 is a schematic top view of an electronic device according to another embodiment of the disclosure.

In some embodiments, as shown in FIG. 12, an electronic device 100g also may not include a chip 210 and a flexible printed circuit board 220, which are shown in FIG. 11. Therefore, a plurality of side regions 114S of the electronic device 100h may respectively overlap a first side surface 163a, a second side surface 163b, a third side surface 163c and a fourth side surface 163d of a second substrate 160h.

In summary, according to some embodiments, by means of forming the auxiliary bonding pad contacting with the first wire, and the second wire (side wiring) and the auxiliary bonding pad include at least one same material, the contact resistance between the second wire and the auxiliary bonding pad may be reduced. Thus, contact between the side wiring and the first wire can be improved. According to some embodiments, the first contact area between the auxiliary bonding pad and the first wire is designed to be larger than the third contact area between the second wire and the first wire, the contact area can be increased. Therefore, the electric transmission between the first wire and the second wire (side wiring) is ensured.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. An electronic device, comprising:
a first substrate, wherein the first substrate has a top surface and a first side surface;
a second substrate oppositely disposed on the first substrate, wherein the second substrate has a second side surface parallel to the first side surface;
a first conductive element disposed on the top surface of the first substrate;

a second conductive element disposed on the first side surface of the first substrate and on the second side surface of the second substrate; and a third conductive element disposed on the top surface of the first substrate and disposed on the first conductive element, wherein the third conductive element contacts the first conductive element to define a first contact area, the third conductive element contacts the second conductive element to define a second contact area, and the first contact area is greater than the second contact area, wherein the first conductive element contacts the second conductive element to define a third contact area, and the second contact area is greater than the third contact area.

2. The electronic device as claimed in claim 1, wherein there is an interface between the third conductive element and the second conductive element.

3. The electronic device as claimed in claim 1, wherein the third conductive element and the second conductive element are formed by different processes.

4. The electronic device as claimed in claim 1, wherein the first conductive element comprises a metal material.

5. The electronic device as claimed in claim 1, wherein the first conductive element comprises Cu, Cu alloy, Al, Al alloy, Mo, Mo alloy, Ti, Ti alloy, indium tin oxide, or combinations thereof.

6. The electronic device as claimed in claim 1, wherein the second conductive element comprises Ag, Ag alloy, Au, Au alloy, Cu, Cu alloy, graphene, carbon nano tube, or combinations thereof.

7. The electronic device as claimed in claim 1, wherein the third conductive element comprises Ag, Ag alloy, Au, Au alloy, Cu, Cu alloy, graphene, carbon nano tube, or combinations thereof.

8. The electronic device as claimed in claim 1, wherein the top surface is parallel to a first plane defined by a first direction and a second direction, the first side surface is parallel to a second plane defined by the second direction and a third direction, and the first direction, the second direction and the third direction are different.

9. The electronic device as claimed in claim 1, further comprising:
a circuit layer disposed on the top surface of the first substrate and within a display region of the electronic device, wherein the first conductive element is electrically connected to the circuit layer.

10. The electronic device as claimed in claim 1, further comprising:
an electric component disposed on a bottom surface of the first substrate, wherein the electric component is electrically connected to the third conductive element through the second conductive element.

11. The electronic device as claimed in claim 1, wherein the third conductive element is disposed on the first conductive element.

* * * * *